(12) United States Patent
Kim et al.

(10) Patent No.: US 11,464,119 B2
(45) Date of Patent: Oct. 4, 2022

(54) ELECTRONIC DEVICE INCLUDING INJECTION STRUCTURE, AND INJECTION MOLD STRUCTURE FOR INJECTION STRUCTURE

(71) Applicant: Samsung Electronics Co., Ltd., Gyeonggi-do (KR)

(72) Inventors: Changsu Kim, Gyeonggi-do (KR); Hangyu Hwang, Gyeonggi-do (KR); Sangsik Na, Gyeonggi-do (KR); Jongbae Jeon, Gyeonggi-do (KR); Pranveer Singh Rathore, Gyeonggi-do (KR); Ingook Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 216 days.

(21) Appl. No.: 16/766,167

(22) PCT Filed: Aug. 27, 2019

(86) PCT No.: PCT/KR2019/010895
§ 371 (c)(1),
(2) Date: May 21, 2020

(87) PCT Pub. No.: WO2020/055006
PCT Pub. Date: Mar. 19, 2020

(65) Prior Publication Data
US 2020/0288583 A1 Sep. 10, 2020

(30) Foreign Application Priority Data
Sep. 13, 2018 (KR) .................. 10-2018-0109432

(51) Int. Cl.
*H05K 5/00* (2006.01)
*B29C 45/26* (2006.01)
(Continued)

(52) U.S. Cl.
CPC .......... *H05K 5/0017* (2013.01); *B29C 45/26* (2013.01); *H04B 1/3827* (2013.01); *H05K 5/0004* (2013.01); *B29L 2031/3481* (2013.01)

(58) Field of Classification Search
CPC .... H05K 5/004; H05K 5/0017; G06F 1/1633; G06F 1/1637; G02F 1/133308
See application file for complete search history.

(56) References Cited

U.S. PATENT DOCUMENTS 6,430,776 B1 * 8/2002 Tan ...................... G06F 1/1681
16/361
9,967,375 B1 * 5/2018 Zhao ..................... G06F 1/1698
(Continued)

FOREIGN PATENT DOCUMENTS

JP  2001293755   10/2001
JP  2013146100   7/2013
(Continued)

OTHER PUBLICATIONS

PCT/ISA/210 Search Report issued on PCT/KR2019/010895, pp. 7.
PCT/ISA/237 Written Opinion issued on PCT/KR2019/010895, pp. 5.

*Primary Examiner* — Hung S. Bui
*Assistant Examiner* — Sagar Shrestha
(74) *Attorney, Agent, or Firm* — The Farrell Law Firm, P.C.

(57) ABSTRACT

An electronic device according to various embodiments of the present disclosure includes a housing including a front plate facing a first direction, a rear plate facing a second direction that is opposite to the first direction, and side members for encompassing the inner space between the front plate and the rear plate; a display shown through at least a portion of the front plate; and a middle plate positioned between the front plate and the rear plate. The middle plate can include a first portion disposed between the front (Continued)

plate and the side members, when viewed from the outside of the housing. The first portion can include: a first surface supporting a portion of the front plate and facing the first direction; a second surface exposed to the outside of the housing; a third surface facing a third direction that is different from the first direction and the second direction, and facing the side surface of the front plate; and a protruding part protruding in the third direction on the third surface.

12 Claims, 15 Drawing Sheets

(51) Int. Cl.
  *H04B 1/3827* (2015.01)
  *B29L 31/34* (2006.01)

(56) References Cited

U.S. PATENT DOCUMENTS

| | | | | |
|---|---|---|---|---|
| 2001/0012769 | A1* | 8/2001 | Sirola | H04M 1/0214 455/566 |
| 2004/0051670 | A1* | 3/2004 | Sato | G06F 1/1616 343/702 |
| 2007/0229475 | A1* | 10/2007 | Gettemy | G06F 1/1643 345/173 |
| 2009/0200378 | A1* | 8/2009 | Doherty | G06F 1/203 235/462.01 |
| 2009/0201636 | A1* | 8/2009 | Doherty | G06F 1/1686 710/1 |
| 2009/0279241 | A1* | 11/2009 | Gettemy | G06F 1/1656 361/679.26 |
| 2009/0291709 | A1* | 11/2009 | Lee | H04M 1/18 455/575.1 |
| 2012/0037523 | A1* | 2/2012 | Diebel | A45C 13/005 206/320 |
| 2012/0133608 | A1* | 5/2012 | Chen | G06F 3/041 345/174 |
| 2012/0250289 | A1* | 10/2012 | Kao | G06F 1/1637 362/97.1 |
| 2013/0242481 | A1* | 9/2013 | Kim | H04M 1/0249 361/679.01 |
| 2014/0184986 | A1* | 7/2014 | Morizu | G06F 1/1601 349/62 |
| 2014/0364178 | A1* | 12/2014 | Hynecek | H04M 1/0202 455/575.8 |
| 2015/0131023 | A1* | 5/2015 | Kim | G02F 1/133308 445/24 |
| 2016/0212887 | A1* | 7/2016 | Nikkhoo | H05K 7/20418 |
| 2016/0233037 | A1 | 8/2016 | Lee et al. | |
| 2017/0067645 | A1 | 3/2017 | Jeong et al. | |
| 2017/0070601 | A1 | 3/2017 | Kim et al. | |
| 2017/0192291 | A1 | 7/2017 | Shi | |
| 2017/0285785 | A1* | 10/2017 | Hwang | H04W 12/06 |
| 2018/0059758 | A1* | 3/2018 | Boatner | G06F 1/266 |
| 2020/0207207 | A1* | 7/2020 | Lesuffleur | G02B 1/14 |
| 2021/0034100 | A1* | 2/2021 | Lesuffleur | H01L 33/44 |

FOREIGN PATENT DOCUMENTS

| | | |
|---|---|---|
| JP | 2013207668 | 10/2013 |
| KR | 1020160097105 | 8/2016 |
| KR | 1020170028164 | 3/2017 |

* cited by examiner

ELECTRONIC DEVICE INCLUDING INJECTION STRUCTURE, AND INJECTION MOLD STRUCTURE FOR INJECTION STRUCTURE

CROSS-REFERENCE TO RELATED APPLICATION(S)

This application is a National Phase Entry of PCT International Application No. PCT/KR2019/010895, which was filed on Aug. 27, 2019 and claims priority to Korean Patent Application No. 10-2018-0109432 filed on Sep. 13, 2018, in the Korean Intellectual Property Office, the contents of which are incorporated herein by reference.

TECHNICAL FIELD

Various embodiments relate to an electronic device including a plate formed as an injection-molded structure, and an injection mold structure for forming the plate.

BACKGROUND

The term "electronic device" may mean a device, such as an electronic scheduler, a portable multimedia reproducer, a mobile communication terminal, a tablet PC, an image/sound device, a desktop PC, a laptop PC, or a vehicular navigation system, as well as a home appliance, that performs a specific function depending on a program incorporated therein. The above-mentioned electronic devices may output, for example, information stored therein as sound or an image. As the degree of integration of electronic devices has increased and super-high-speed and large-capacity RF communication has become popular, various functions have recently been provided in a single electronic device, such as a mobile communication terminal. For example, various functions, such as an entertainment function (e.g., a game function), a multimedia function (e.g., a music/video reproduction function), a communication and security function for mobile banking or the like, a schedule management function, and an e-wallet function, are integrated in a single electronic device, in addition to a communication function.

Some components of the electronic device may be implemented as an injection-molded product by using a mold structure. For example, an injection-molded product may be implemented by introducing a resin-based material into a cavity of a mold having an inner space corresponding to a shape of a portion of an electronic device and then performing a cooling process. As another example, by providing a region configured to seat a bracket including a metallic material thereon in the inner space of the mold, an injection-molded structure extending from a region of the bracket may be provided.

SUMMARY

In general, the gas generated in the process of filling a hot molten material into the cavity of a mold for injection molding, and the gas remaining in the space inside the mold are not smoothly discharged to the outside, which may deteriorate the quality of an injection-molded product. For example, when a gas vent is formed in a parting line (P/L) region of an injection mold structure, a burr or flake may be generated in a gap in a gas vent portion in the P/L region, which may cause a portion of the appearance of the injection-molded product to include a rough surface or a gas stain.

For the injection-molded article formed to a rough surface, it is necessary to perform a separate removal operation for removing the rough surface. Due to this, an injection article made of a glossy material may be additionally damaged, which may cause a material cost and a time cost due to a new painting process.

According to various embodiments, in an injection mold structure for manufacturing an injection-molded article of an electronic device, it is intended to provide a gas vent structure capable of simplifying a process.

According to various embodiments, it is possible to provide an unpainted glossy injection-molded face to an injection-molded portion of an electronic device without adding a separate removal process.

An electronic device according to various embodiments may include: a housing including a front plate oriented in a first direction, a rear plate oriented in a second direction opposite the first direction, and a side member surrounding an internal space between the front plate and the rear plate; a display visible through at least a portion of the front plate; and a mid-plate located between the front plate and the rear plate. The mid-plate may include a first portion disposed between the front plate and the side member when viewed from an outside of the housing. The first portion may include: a first surface supporting a portion of the front plate and oriented in the first direction; a second surface exposed to the outside of the housing; a third surface oriented in a third direction different from the first direction and the second direction, and facing a side face of the front plate; and a protrusion protruding in the third direction on the third surface.

An electronic device may include a display and a housing including a first region including a portion exposed to an outside of the electronic device and a second region supporting at least a portion of the display. The first region may include: a first section extending from an end of the second region; a second section extending from the first section in a first direction and including at least one protrusion protruding into the electronic device; and a third section extending from the second section in the first direction and including a curved shape on a face oriented in the first direction. The protrusion may be disposed not to be exposed to an outside of the electronic device.

An injection mold structure for manufacturing at least a portion of an electronic device, according to various embodiments, may include: an upper core structure; a lower core structure configured to be coupled with the upper core structure; and a gas vent structure disposed inside the upper core structure and configured to discharge gas generated during molding to an outside. The gas vent structure may be disposed to penetrate at least a portion of an inner portion of the upper core, and a region adjacent to a lower end portion of the gas vent structure may form an inclined face including a predetermined slope.

According to various embodiments, an electronic device may include an injection-molded product having an unpainted glossy injection-molded face.

According to various embodiments, since no painting process is required in manufacturing an electronic device, it is possible to reduce a material cost. In addition, since no burr or flake is generated in the appearance parting line (P/L line) of an injection-molded product, it is possible to implement an injection-molded product that does not require a separate additional removal process.

According to various embodiments, an injection mold structure for molding an electronic device is capable of preventing a gas from being trapped in a portion of an injection-molded product by improving a gas vent structure. Accordingly, it is possible to provide some improved structures for an electronic device.

With an injection mold structure for molding a portion of an electronic device according to various embodiments, it is possible to dispose a gas passage, which is provided by a gas vent structure, in a portion, which is not substantially visible from the appearance of the electronic device. Accordingly, it is possible to provide a beautiful electronic device because no foreign matter is generated in the appearance of an injection-molded product.

DETAILED DESCRIPTION

Figure 1:
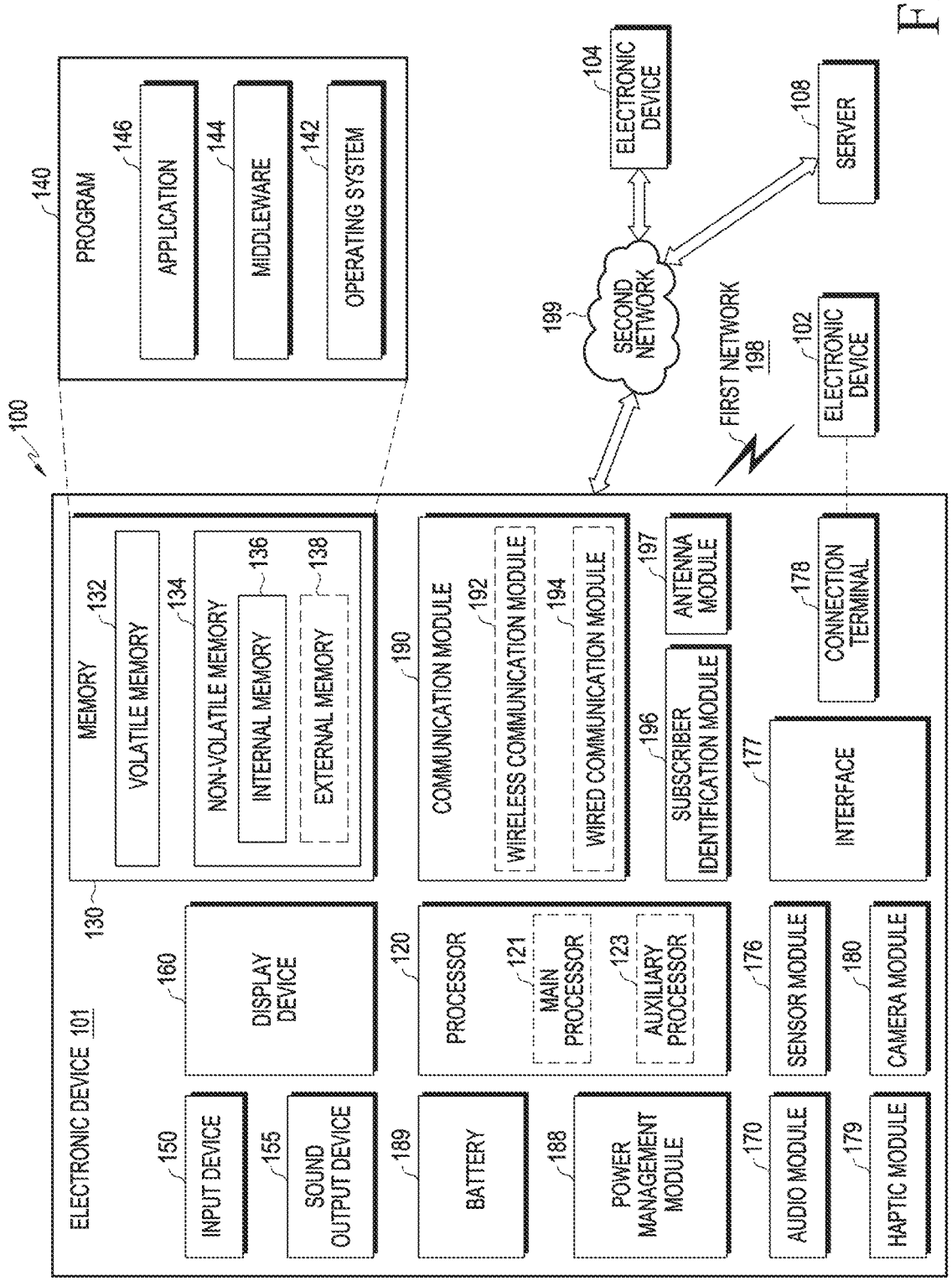
FIG. 1 is a block diagram of an electronic device in a network environment, according to various embodiments of the disclosure.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via, which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GLASS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (WIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A. or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurally of components in the same or similar manner as they are performed by a corresponding one of the plurality of components before the integration. According to various embodiments, operations performed by the module, the program, or another component may be carried out sequentially, in parallel, repeatedly; or heuristically, or one or more of the operations may be executed in a different order or omitted, or one or more other operations may be added.

Some configurations of an electronic device according to various embodiments may include an injection-molded surface formed by an injection mold structure. An injection-molded surface formed by the injection mold structure may include an outer surface of the electronic device, or may support various electronic components or the like inside the electronic device.

Figure 2A:
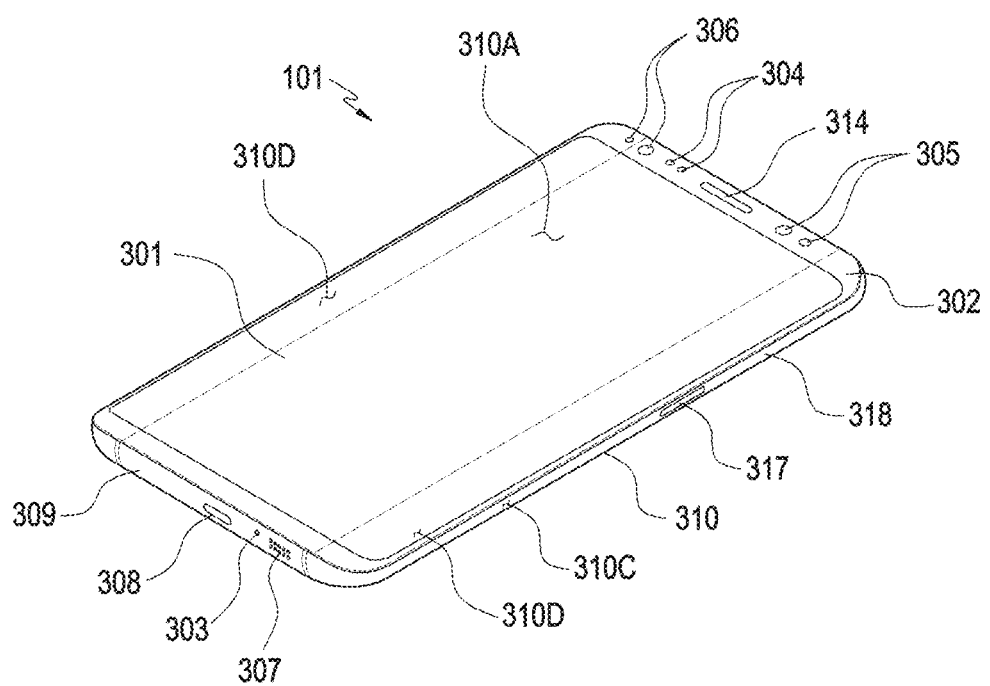
FIG. 2A is a perspective view illustrating the front side of an electronic device 101 according to various embodiments of the disclosure.

FIG. 2A is a perspective view illustrating the front side of an electronic device 101 according to various embodiments.

Figure 2B:
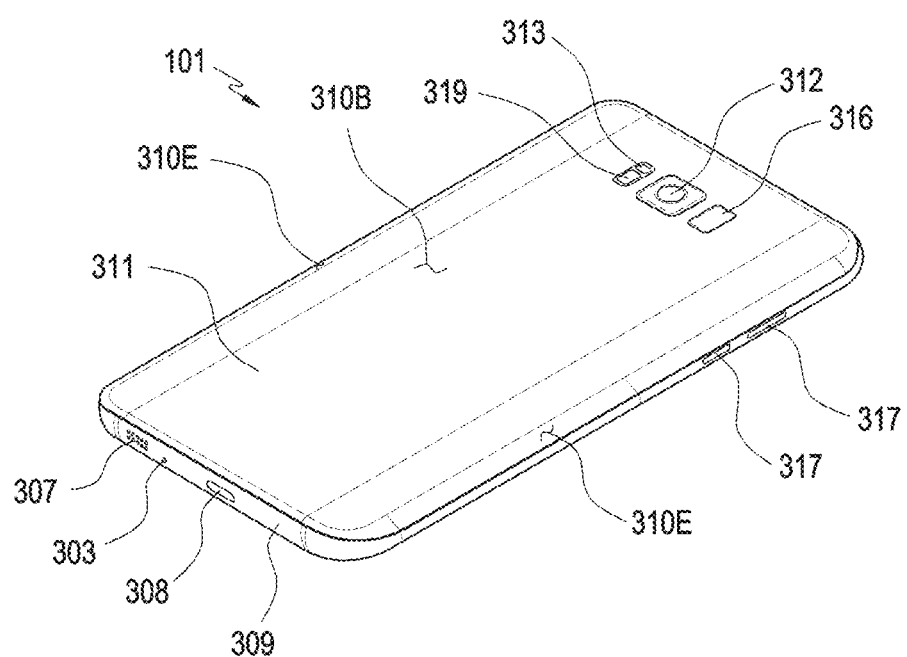
FIG. 2B is a perspective view illustrating the rear side of the electronic device 101 according to various embodiments of the disclosure.

FIG. 2B is a perspective view illustrating the rear side of the electronic device 101 according to various embodiments.

Referring to FIGS. 2A and 2B, the electronic device 101 according to an embodiment may include: a housing 310 including a first face (or a front face) 310A, a second face (or a rear face) 310B, and a side face 310C surrounding the space between the first face 310A and the second face 310B. In another embodiment (not illustrated), the term "housing" may mean a structure forming a part of the first face 310A, the second face 310B, and the side face 310C in FIG. 2A. According to an embodiment, at least a portion of the first face 310A may be formed by a substantially transparent front plate 302 (e.g., a glass plate or a polymer plate including various coating layers). The second face 310B may be formed by a substantially opaque rear plate 311. The rear plate 311 may be formed of, for example, coated or colored glass, ceramic, a polymer, or a metal (e.g., aluminum, stainless steel (STS), or magnesium), or a combination of two or more of these materials. The side face 310C may be formed by a side bezel structure 318 (or a "side member") coupled to the front plate 302 and the rear plate 311 and including a metal and/or a polymer. In some embodiments, the rear plate 311 and the side bezel structure 318 may be integrally formed, and may include the same material (e.g., a metallic material such as aluminum).

In the illustrated embodiment, the front plate 302 may include, at the long opposite side edges thereof, two first regions 310D, which are bent from the first face 310A towards the rear plate 311 and extend seamlessly. In the illustrated embodiment (see FIG. 3), the rear plate 311 may include, at the long opposite side edges thereof, two second regions 310E, which are bent from the second face 310B towards the front plate 302 and extend seamlessly. In some embodiments, the front plate 302 (or the rear plate 311) may include only one of the first regions 310D (or the second regions 310E). In another embodiment, some of the first regions 310D and the second regions 310E may not be included. In the embodiments described above, when viewed from a side of the electronic device 101, the side bezel structure 318 may have a first thickness (or width) on the side face portions, which do not include the first regions 310D or the second regions 310E, and may have a second thickness (or width), which is smaller than the first thickness, on the side face portions, which include the first regions 310D or the second regions 310E.

According to an embodiment, the electronic device 101 may include at least one of a display 301, audio modules 303, 307, and 314, sensor modules 304, 316, and 319, camera modules 305, 312, and 313, key input devices 317, light-emitting elements 306, and connector holes 308 and 309. In some embodiments, at least one of the components (e.g., the key input devices 317 or the light-emitting elements 306) may be omitted from the electronic device 101, or other components may be additionally included in the electronic device 101.

According to an embodiment, the display 301 may be exposed through a substantial portion of, for example, the front plate 302. In some embodiments, at least a portion of the display 301 may be exposed through the front plate 302 forming the first face 310A and the first regions 310D of the side face 310C. In some embodiments, the edges of the display 301 may be formed to be substantially the same as the shape of the periphery of the front plate 302 adjacent thereto. In another embodiment (not illustrated), the distance between the periphery of the display 301 and the periphery of the front plate 302 may be substantially constant in order to enlarge the exposed area of the display 301.

In another embodiment (not illustrated), recesses or openings may be formed in some portions of the screen display region of the display 301, and one or more of the audio module 314, the sensor module 304, the camera module 305, and the light-emitting elements 306 may be aligned with the recesses or the openings. In another embodiment (not illustrated), the rear face of the screen display region of the display 301 may include one or more of the audio module 314, the sensor module 304, the camera module 305, the fingerprint sensor 316, and the light-emitting elements 306. In another embodiment (not illustrated), the display 301 may be coupled to or disposed adjacent to a touch-sensitive circuit, a pressure sensor that is capable of measuring a touch intensity (pressure), and/or a digitizer that detects a magnetic-field-type stylus pen. In some embodiments, at least some of the sensor modules 304 and 519 and/or at least some of the key input devices 317 may be disposed in the first regions 310D and/or the second regions 310E.

According to an embodiment, the audio modules 303, 307, and 314 may include a microphone hole 303 and speaker holes 307 and 314. The microphone hole 303 may include a microphone disposed therein so as to acquire external sound, and in some embodiments, multiple microphones may be disposed therein so as to detect the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker may be included without the speaker holes 307 and 314 (e.g., a piezo speaker).

According to an embodiment, the sensor modules 304, 316, and 319 may generate an electrical signal or a data value corresponding to the internal operating state or an external environmental state of the electronic device 101. The sensor modules 304, 316, and 319 may include, for example, a first sensor module 304 (e.g., a proximity sensor), a second sensor module (not illustrated) (e.g., a fingerprint sensor) disposed on the first face 310A of the housing 310, a third sensor module 319 (e.g., an FIRM sensor), and/or a fourth sensor module 316 (e.g., a fingerprint sensor) disposed on the second face 310B of the housing 310. The fingerprint sensor may be disposed not only on the first face 310A of the housing 310 (e.g., the display 301), but also on the second face 310B. The electronic device 101 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 305, 312, and 313 may include, for example, a first camera device 305 disposed on the first face 310A of the electronic device 101 and a second camera device 312 and/or a flash 313 disposed on the second face 310B of the electronic device 101. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera lens, a wide-angle lens, and a telephoto lens) and image sensors may be disposed on one face of the electronic device 101.

According to an embodiment, the key input devices 317 may be disposed on the side face 310C of the housing 310. In another embodiment, the electronic device 101 may not include some or all of the above-mentioned key input devices 317, and a key input device 317, which is not included in the electronic device 100, may be implemented in another form, such as a soft key, on the display 301. In some embodiments, the key input devices may include a sensor module 316 disposed on the second face 310E of the housing 310.

According to an embodiment, the light-emitting element 306 may be disposed on, for example, the first face 310A of the housing 310. The light-emitting element 306 may provide, for example, information about the state of the electronic device 101 in an optical form. In another embodiment, the light-emitting element 306 may provide a light source that is interlocked with, for example, the operation of the camera module 305. The light-emitting element 306 may include, for example, an LED, an IR LED, and a xenon lamp.

Figure 3:
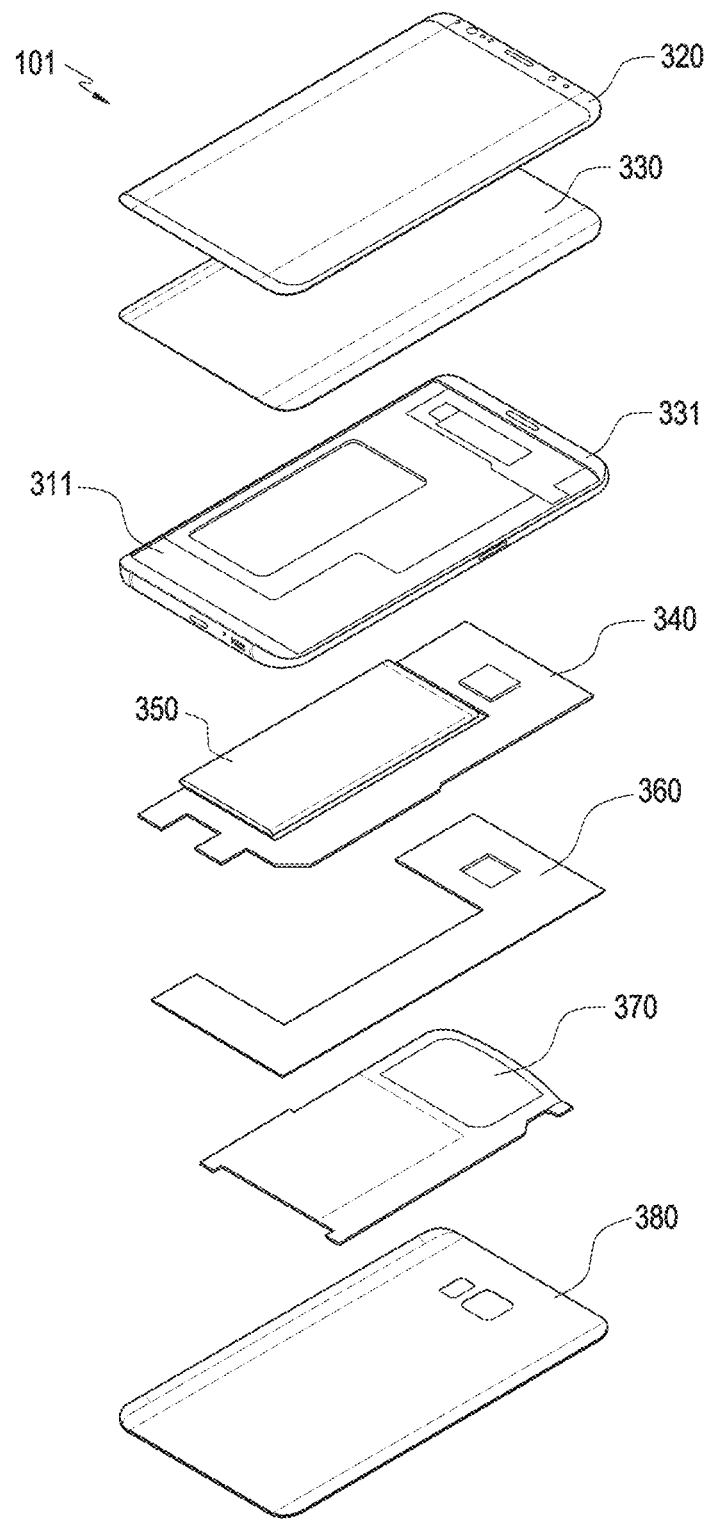
FIG. 3 is an exploded perspective view illustrating the electronic device according to various embodiments of the disclosure.

According to an embodiment, the connector holes 308 and 309 may include a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device, FIG. 3 is an exploded perspective view illustrating an electronic device 101 according to various embodiments.

Referring to FIG. 3, the electronic device 101 (e.g., the electronic device 101 in FIGS. 1 to 2B) may include a side bezel structure 331, a first support member 332 (e.g., a bracket), a front plate 320, a display 330, a printed circuit board 340, a battery 350, a second support member 360 (e.g., a rear case an antenna 370, and a rear plate 380. In some embodiments, at least one of the components (e.g., the first support member 332 or the second support member 360) may be omitted from the electronic device 101, or other components may be additionally included in the electronic device 101. At least one of the components of the electronic device 101 may be the same as or similar to at least one of the components of the electronic device 101 of FIG. 2A or 2B, and a redundant description thereof is omitted below.

According to an embodiment, the first support member 332 may be disposed inside the electronic device 101 so as to be connected to the side bezel structure 331, or may be integrally formed with the side bezel structure 331. The first support member 332 may be formed of, for example, a metallic material and/or a non-metallic material (e.g., a polymer). The display 330 may be coupled to one face of the first support member 332, and the printed circuit board 340 may be coupled to the other face of the first support member 32. On the printed circuit board 340, a processor, memory, and/or an interface may be mounted. The processor may include at least one of, for example, a central processing unit, an application processor, a graphics processor, an image signal processor, a sensor hub processor, or a communication processor.

According to an embodiment, the memory may include, for example, volatile memory or nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 101, to an external electronic device, and may include a USB connector, an SD card/an MMC connector, or an audio connector.

According to an embodiment, the battery 350 is a device for supplying power to at least one component of the electronic device 101, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed within the electronic device 101, or may be detachably mounted on the electronic device 101.

According to an embodiment, the antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 331, a portion of the first support member 332, or a combination thereof.

Figure 4A:
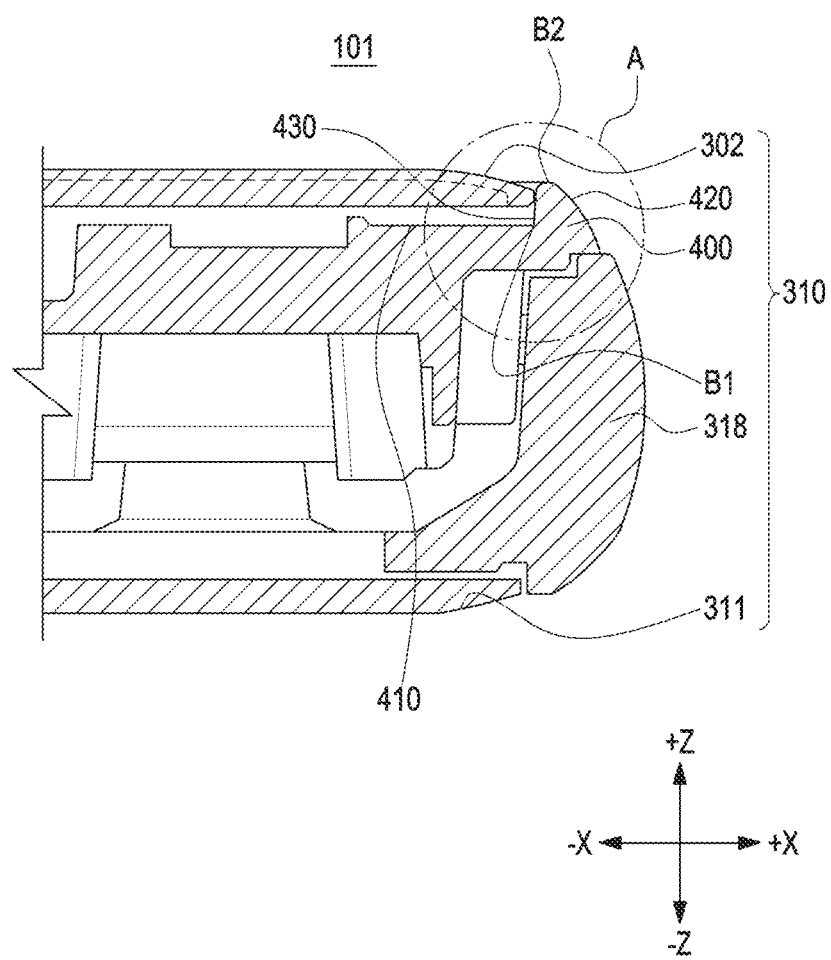
FIG. 4A is a cross-sectional view illustrating an edge region of an electronic device housing according to various embodiments of the disclosure.
Figure 4B:
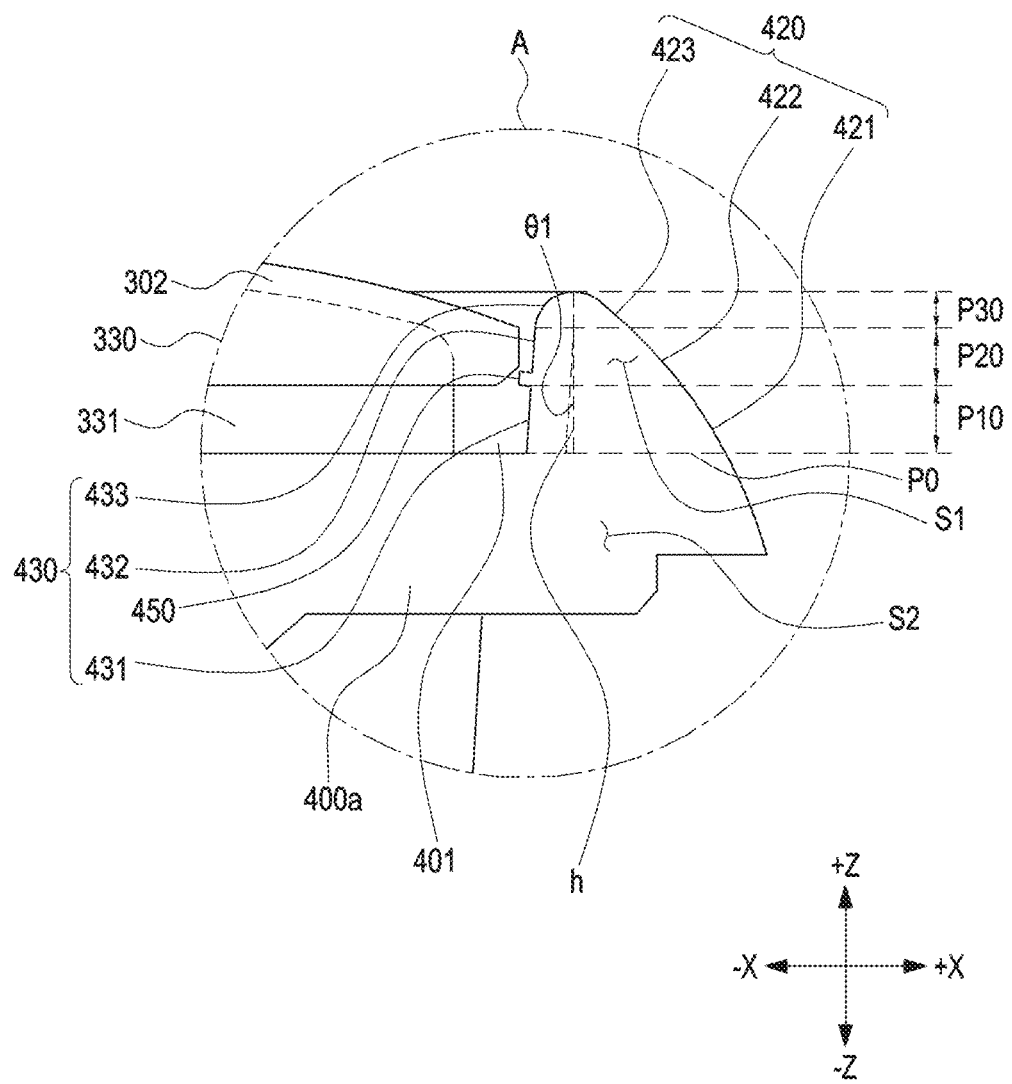
FIG. 4B is an enlarged cross-sectional view of a region of FIG. 4A.

FIG. 4A is a cross-sectional view illustrating an edge region of an electronic device housing according to various embodiments. FIG. 4B is an enlarged cross-sectional view of a region of FIG. 4A.

Referring to FIGS. 4A and 4B, the electronic device 101 may include a housing 310, a display 330 including a screen region disposed in the housing 310 exposed through the front face (e.g., in a first direction (+Z axis direction)), and an adhesive member 331 for bonding the housing 310 and the display 330. The housing 310 may further include a mid-plate 400 disposed to at least partially face the display 330. The configurations of the housing 310 and the display 330 of FIGS. 4A and 4B may be partially or wholly the same as the configurations of the housing 310 and the display 301 or 330 in FIGS. 2A to 3.

In FIG. 4, "X" in a 2-axis orthogonal coordinate system may indicate the longitudinal direction of the housing 310, and "Z" may indicate the thickness direction of the housing 310. In addition, in an embodiment, "Z" may indicate a first direction (+Z axis direction) or a second direction (−Z axis direction), and "X" may indicate a +X axis direction or a −X axis direction.

According to various embodiments, the housing 310 may include a front plate 302 oriented in the first direction (+Z axis direction), a rear plate 311 oriented in the second direction (−Z axis direction) opposite the first direction (+Z axis direction), and a side member 318 surrounding the space S between the front plate 302 and the rear plate 311. A printed circuit board (e.g., the printed circuit board 340 in FIG. 3) and/or a battery (e.g., the battery 350 in FIG. 3) may be accommodated in the interior (e.g., the internal space) of the housing 110. For example, a processor, a communication module, various interfaces, a power management module, or a control circuit may be configured in the form of an integrated circuit chip, and may be mounted on a printed circuit board 340. For example, the control circuit may be a part of the above-described processor or communication module.

According to various embodiments, the housing 310 may include a mid-plate 400 including at least one recess 401 opened to be oriented in the first direction (+Z axis direction). Within the recess 401 of the mid-plate 400, the display 330 may be accommodated. According to an embodiment, the display device 330 may be at least partially made of a material that transmits radio waves or magnetic fields. For example, the display may include a display panel disposed to face a window member, which is made of a tempered glass, and mounted on the inner face of the window member. A touch panel may be mounted between the window member and the display 330. For example, the display 330 may be an output device for outputting a screen, and may be utilized as an input device provided with a touch screen function.

Figure 5:
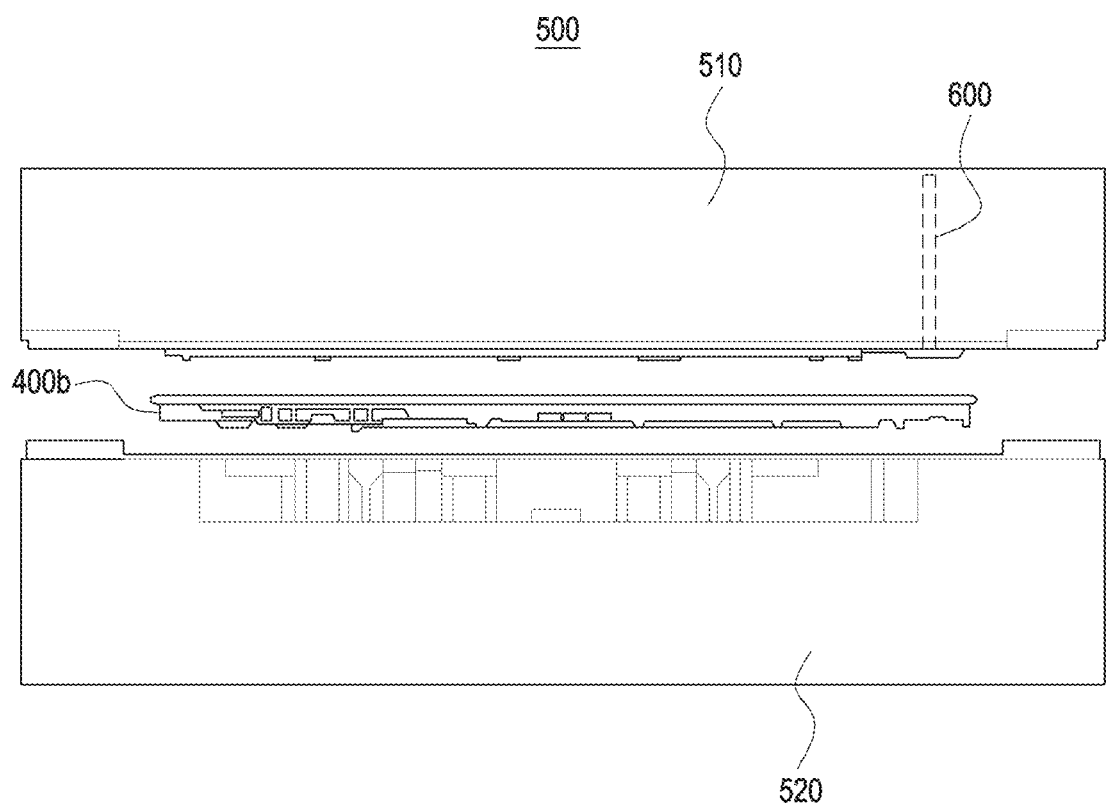
FIG. 5 is an exploded perspective view illustrating an injection mold structure for manufacturing a portion of an electronic device, according to various embodiments of the disclosure, in a separated state.

According to various embodiments, the mid-plate 400 is located between the front plate 302 and the rear plate 311, and may include a side bezel structure 400a (e.g., the side bezel member 331 in FIG. 3) and a bracket 400b (e.g., the first support member 332 in FIG. 3, or the bracket 400b in FIG. 5). The side bezel structure 400a and the bracket 400b are configured to accommodate various electronic components and the like, and may be at least partially made of a conductive material.

According to various embodiments, the bracket 400b may include a metallic material, and may include sidewalls forming the outer face of the electronic device 101. The side bezel structure 400a may include a non-metallic material formed as an insert injection-molded structure in the bracket 400b. The side bezel structure 400a may be made of a resin material. For example, the side bezel structure 400a may be made of at least one of polystyrene (PS), actylonitile butadiene styrene (ABS), polyphthalamide (PPA), polyamide (PA), polyphenylene sulfide (PPS), modified polyphenylene oxide (MPPO), acrylic, or polycarbonate (PC). As another example, each of the above-mentioned resin compounds may implement a side bezel structure in which mechanical heat resistance or rigidity is reinforced by adding at least one of talc, glass fiber, carbon fiber, glass wool, tempered glass beads, wollastonite, and granite mica thereto.

According to various embodiments, at least a portion of the side bezel structure 400a of the mid-plate 400 may be disposed to surround the bracket 400b and may be disposed along the edge region of the housing 310. For example, referring to FIGS. 4A and 4B, when the side plate bezel structure 400a of the mid-plate 400 may include a first portion A, which is at least partially disposed between the front plate 302 and the side member 318 when viewed from the outside of the housing 310.

According to various embodiments, the first portion A may include a first surface 410 configured to support a portion of the front plate 302 and oriented in the first direction (+Z axis direction), a second surface 420 exposed to the outside of the housing 310, and a third surface oriented in a third direction different from the first direction (+Z axis direction) and the second direction (−Z axis direction) and facing the side face of the front plate 302. As another example, the first portion A may include a protrusion 450 protruding in the third direction on the third surface 430. According to an embodiment, the protrusion 450 may be located between a first point B1 at which the first surface 410 and the third surface 430 join and a second point B2 at which the second surface 420 and the third surface 430 join. As another example, the protrusion 450 may be disposed at substantially the same distance from the first point B1 and the second point B2. According to an embodiment, the protrusion 450 may be disposed at a position adjacent to the second point B2 from an intermediate point between the first point B1 and the second point B2. For example, the protrusion 450 may be formed by performing an injection molding process in the state in which an inclined face 613 of a gas vent structure 600 is disposed at a height of ½ or more of the distance between the first point B1 and the second point B2.

According to an embodiment, the first portion A of the side bezel structure 400a may include a first region S1 including a portion exposed to the outside of the electronic device 101 and a second region S2 extending from the first region S1 and supporting the display 330. The first region S1 may form a portion of the side face of the electronic device 101, and may include the second surface 420 and the third surface 430. The second region S2 may be disposed in the internal space of the electronic device 101, and may include the first surface 410. The first region S1 and the second region S2 may accommodate at least a portion of the display 330.

According to one embodiment, the first region S1 is disposed to face the front side (e.g., in the first direction (+Z axis direction)) from the end of the second region S2 including the plate shape. The first region S1 may include a first section P10 extending from the second region S2, a second section P20 extending from the first section P10 toward the front side, and a third section P30 extending from the second section P20 toward the front side and having both ends of one surface facing the front side provided in a curved shape.

According to an embodiment, when viewed in the cross section, the first region S1 may include a boundary P0 at which the first region S1 is in contact with the second region S2 or extends from the second region S2 and which forms a lower line of the first region S1, and second and third surfaces 420 and 430, which protrude toward the front side from the boundary P0 and form the side face of the electronic device 101. The second surface 420 may be provided as a face exposed to the outside of the electronic device 101, and the third surface 430 may be provided as a face facing the inside of the electronic device 101.

According to an embodiment, at least a portion of the third surface 430 of the first region S1 (e.g., the third surface 430 in the first section P10 and the second section P20) may form a predetermined slope with respect to the first direction (+Z axis direction). For example, the height h of the first region S1 may correspond to the length from the first surface (e.g., the boundary P0 between the first region S1 and the second region S2) to the end of the third section P30 oriented in the first direction (+Z axis direction). Substantially, the third surface 430 may be oriented in a direction perpendicular to the first surface 410 of the second region S2. With respect to the height h, the third surface 430 may form a slope $\theta_1$ of about 1 to 4 degrees. As another example, with respect to the height h, the inclined face of the third surface 430 may form a slope $\theta_1$ of about 2 to 3 degrees.

According to an embodiment, the inclined face of the third surface 430 may be provided as a surface formed by the first section P10 and the second section P20. The inclined face of the third surface 430 may be formed in the direction in which the recess 401 formed in the side bezel structure 400a is widened toward the upper side. As another example, the inclined face (the inclined face 613 in FIG. 7A) of the third surface 430 may provide a slope formed in a direction away from the display 330 toward the upper side.

According to an embodiment, the first region S1 may form a region that decreases sequentially in the first direction (+Z axis direction). For example, the first region S1 may be formed in a shape inclined or curved such that the second section P20 and the third section P30 gradually decrease in size (e.g., the occupied volume) from the first section P10 toward the second section P20 and the third section P30.

According to an embodiment, the first section P10 may include a $(3-1)_{th}$ face 431 and a $(2-1)_{th}$ face 421 forming the lower end regions of the third surface 430 and the second surface 420. The $(3-1)_{th}$ face 431 may be disposed to include a flat line having a predetermined slope $\theta_1$. As another example, the $(2-1)_{th}$ face 421 may form a curved face. The length of the $(3-1)_{th}$ face 431 forming the first section P10 may be about 40 to 60% of the total length of the third surface 430. As another example, the length of the $(3-1)_{th}$ face 431 may be about ½ of the total length of the third surface 430. As another example, the length of the $(3-1)_{th}$ face 431 forming the first section P10 extends from the first surface 410 of the second region S2 to the end at which the protrusion 450 is formed. As another example, the $(3-1)_{th}$ face 431 may be disposed to face at least a portion (e.g., the side face) of the adhesive member 331.

According to an embodiment, the second section P20 is a region laminated upwards from the first section P10, and may include a $(3-2)_{th}$ face 432 and a $(2-2)_{th}$ face 422 forming the intermediate regions of the third surface 430 and the second surface 420. The $(3-2)_{th}$ face 432 may be disposed to include a flat line having a predetermined slope $\theta_1$. As another example, the $(2-2)_{th}$ face 422 may form a curved face.

According to one embodiment, the second section P20 may include a section in which a sectioned vent structure (e.g., the gas vent structure 600 in FIGS. 8A and 8B) of an upper core structure 510 of an injection mold structure (e.g., the injection mold structure 500 in FIG. 5) is to be disposed. For example, the gas vent structure 600 for forming the side bezel structure 400a and for discharging gas may be located on a portion of the $(3-2)_{th}$ face 432. The second section P20 may include a protrusion 450 protruding toward the recess 401 (e.g., toward the internal space of the electronic device 101). For example, the protrusion 450 may be disposed in a region of the $(3-2)_{th}$ face 432, and may be formed in the area in which the gas vent structure 600 for discharging gas is located. As another example, the protrusion 450 may be a burr or flake generated when an injection-molded product is formed, and may not be exposed when viewed from the outside of the electronic device 101.

According to an embodiment, the third section P30 is a region laminated upwards from the first section P20, and may include a $(3-3)_{th}$ face 433 and a $(2-3)_{th}$ face 423 forming the upper regions of the third surface 430 and the second surface 420. The third section P30 is a configuration in which substantially most of the region thereof is exposed outside the electronic device, and the $(3-3)_{th}$ face 433 may form a curved face, and the $(2-3)_{th}$ face 423 may also form a curved face. For example, the $(3-3)_{th}$ face 433 is a portion where the curved surface starts, and a curved line of the curved shape may extend from the $(3-3)_{th}$ face 433 of the third section P30 to the $(2-2)_{th}$ face 422 of the second section P20 and the $(2-1)_{th}$ face 421 of the first section P10 via the $(2-3)_{th}$ face 423 of the third section P30. In the illustrated embodiment, the curved face of the first region S1 may be curved toward the side face of the electronic device 101 and may seamlessly extend.

According to an embodiment, the height forming the third section P30 may be smaller than those of the first section P10 and the second section P20, and may have a length of about 0.1 to 0.4 mm. As another example, the third height forming the third section P30 may have a length of about 0.2 mm. However, the height of the third section P30 is not limited thereto, and may be provided in a different length including a curved face depending on the shape of the electronic device 101.

Figure 6A:
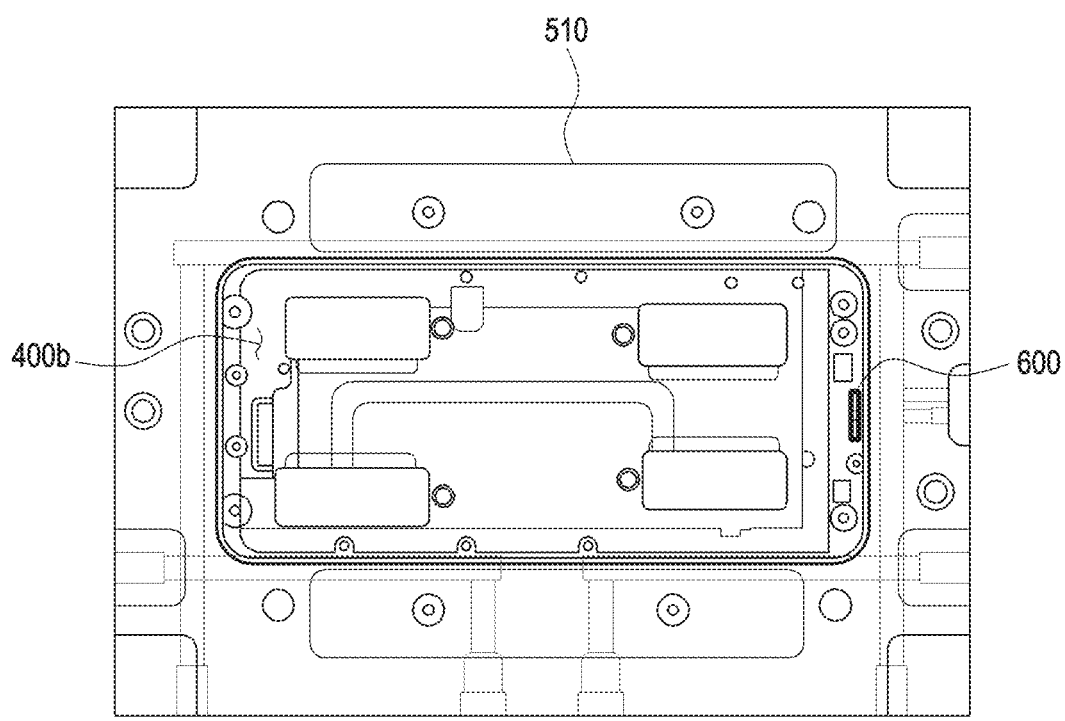
FIG. 6A is a view of the upper core structure of the injection mold structure of FIG. 5, as viewed from the top, according to various embodiments of the disclosure.
Figure 6B:
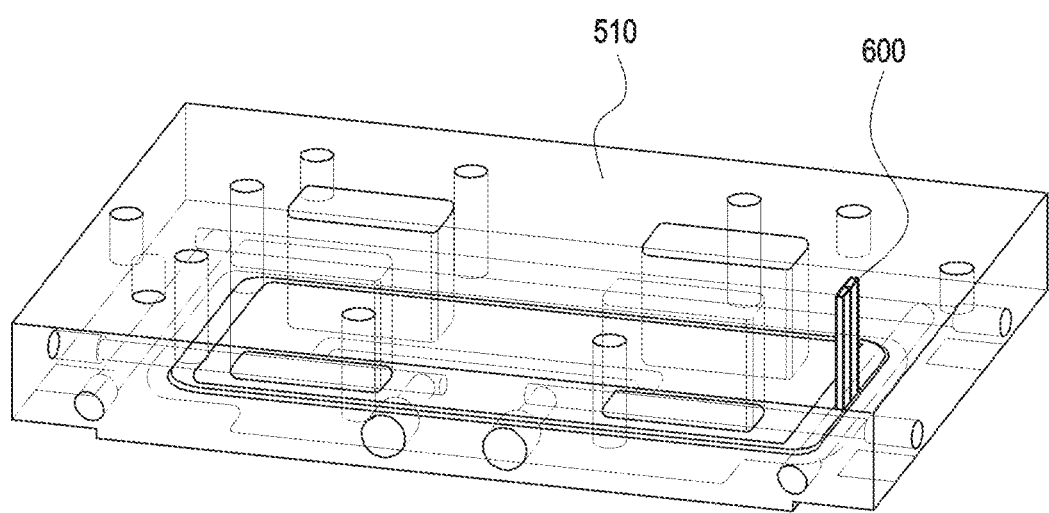
FIG. 6B is a perspective view illustrating the inside of the upper core structure of the injection mold structure of FIG. 5 according to various embodiments of the disclosure.
Figure 7A:
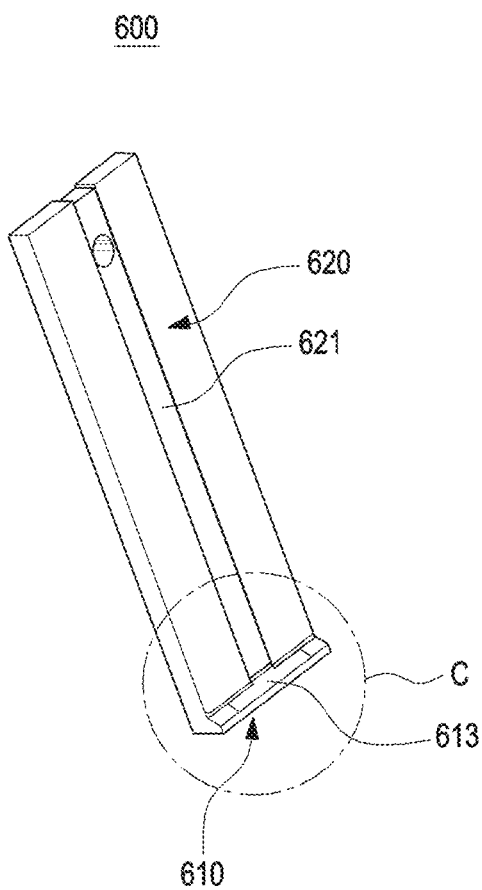
FIG. 7A and FIG. 7B are a perspective view of the gas vent structure disposed inside the upper core structure of FIGS. 6A and 6B, according to various embodiments of the disclosure.
Figure 7B:
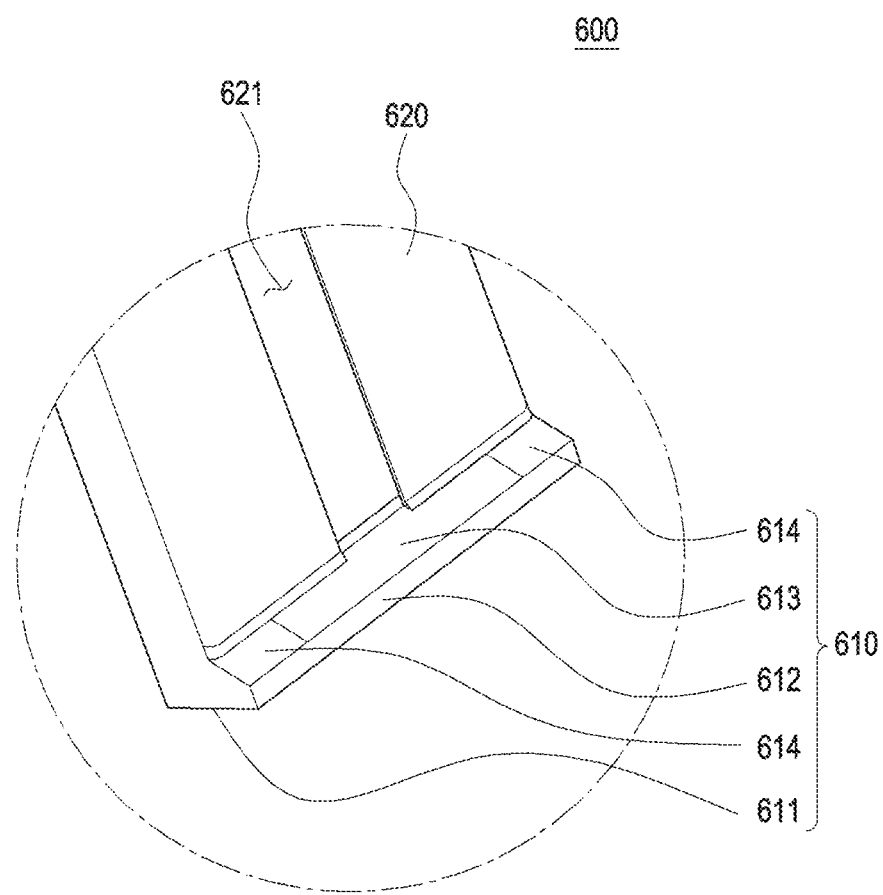

FIG. 5 is an exploded perspective view illustrating an injection mold structure for manufacturing a portion of an electronic device, according to various embodiments in a separated state. FIG. 6A is a bottom view of the upper core structure of the injection mold structure of FIG. 5. FIG. 6B is a perspective view illustrating the inside of the upper core structure of the injection mold structure of FIG. 5 as a projection. FIG. 7A is a perspective view of the gas vent structure disposed inside the upper core structure of FIGS. 6A and 6B, and FIG. 7B is an enlarged perspective view of the region indicated by C in FIG. 7B.

Referring to FIGS. 5 to 7B, an injection mold structure 500 for manufacturing a portion of the housing 310 of the electronic device 101 of FIGS. 2 to 4B may include an upper core structure 510, a lower core structure 520, and a gas vent structure 600 disposed inside the upper core structure 510.

According to various embodiments, a bracket 600b is inserted into the upper core structure 510 and the lower core structure 520, a molten resin is introduced into cavities provided in the upper core structure 510 and the lower core structure 520, and the introduced molten resin is cured. In this manner, it is possible to implement the desired shape of the housing 310. An injection molding process may generate gas from the molten injection material and the gas may cause defects in injection molding. For example, due to the gas generation, quality defects such as an unmolded portion, a welded line, and a poor dimension of an injection molded product (e.g., the housing 310) may occur on the product. When the gas is not properly discharged from the inside of the upper core structure 510 and the lower core structure 520, injection pressure may increase to increase a production time, and may thus shorten the life of the mold.

According to various embodiments, in order to smoothly discharge the generated gas, the upper core structure 510 may include at least one gas vent structure 600 therein. The at least one gas vent structure 600 may be disposed to penetrate one side of the upper core structure 510, and one surface of the lower end portion thereof may be disposed to be in contact with a region of the side bezel structure (e.g., the side bezel structure 400a in FIG. 4B), and at least a portion of the upper end portion thereof may be exposed to the outside.

According to various embodiments, the gas vent structure 600 may be disposed to be separated from the upper core structure 510. For example, the gas vent structure 600 may be fixed inside the upper core structure 510 for injection molding, and may then be separated for cleaning, and a separation process may be performed in order to insert a gas vent structure having another shape for another molding.

Referring to FIG. 7A and FIG. 7B, which is an enlarged view of the region C in FIG. 7A, the gas vent structure 600 may be provided as a single plate shape as a whole, and may include a gas vent portion 610 through which gas is practically discharged and a guide portion 620, which extends from the gas vent portion 610 and guides the path of gas. The gas vent portion 610 is a portion capable of coming into contact with a region of the injection-molded product of the mid-plate 400, and a part of the lower face 611 and the side face 612 thereof may form a cavity. An inclined face 613 extending from the side face 612 may provide a passage through which gas generated during injection molding is emitted. The inclined face 613 may include a flat line shape, and may form a predetermined angle (e.g., the predetermined angle $\theta_2$ in FIG. 9) and a predetermined length (e.g., the predetermined length $l_2$ in FIG. 9) with respect to the lower face 611.

According to one embodiment, a passage through which the gas generated in the injection molding process flows is provided substantially at the center of the inclined face 613, and support portions 614, which are formed at the opposite end portions of the inclined face 613, are disposed in the upper core structure 510 so as to support the gas vent structure 600 such that the gas vent structure 600 is not shaken during the injection molding process.

According to various embodiments, the guide portion 620 forms most of the region of the gas vent structure 600, and may penetrate the core structure 510 so as to provide a path, through which the gas discharged from the inclined face 613 is discharged to the outside. The guide portion 620 may further include a guide groove 621, and the guide groove 621 and the upper core structure 510 may be combined with each other so as to form a single tube. The formed tube may be disposed in a direction perpendicular to the lower face 611, so that gas can be quickly discharged to the outside. The gas vent structure 600 is formed as a single structure with which only one region of the mid plate 400 is capable of coming into contact. However, without being limited thereto, a plurality of gas vent structures may be provided in various regions for discharging gas from the mid-plate 400. As another example, the gas vent structure 600 is provided in a closed line shape surrounding the edge of the mid-plate 400, and may be integrally formed along the entire section of the mid-plate 400.

In general, when the gas vent structure 600 is not separately provided in the region of the upper core structure 510, gas may be trapped in the curved portion of the mid-plate 400, which becomes a distal end during injection molding, and thus an incomplete injection-molded product may be manufactured. In the gas vent structure 600 according to an embodiment, the gas is discharged to the outside before the molding is completed (e.g., before gas is trapped in the curved portion of the housing 310), and thus it is possible to improve the quality of an injection-molded product.

Figure 8A:
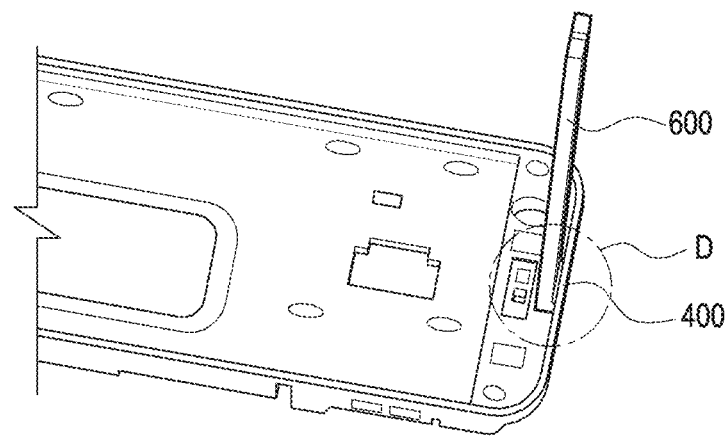
FIG. 8A is a perspective view illustrating a gas discharge region formed due to contact between a gas vent structure and a mid-plate, according to various embodiments.
Figure 8B:
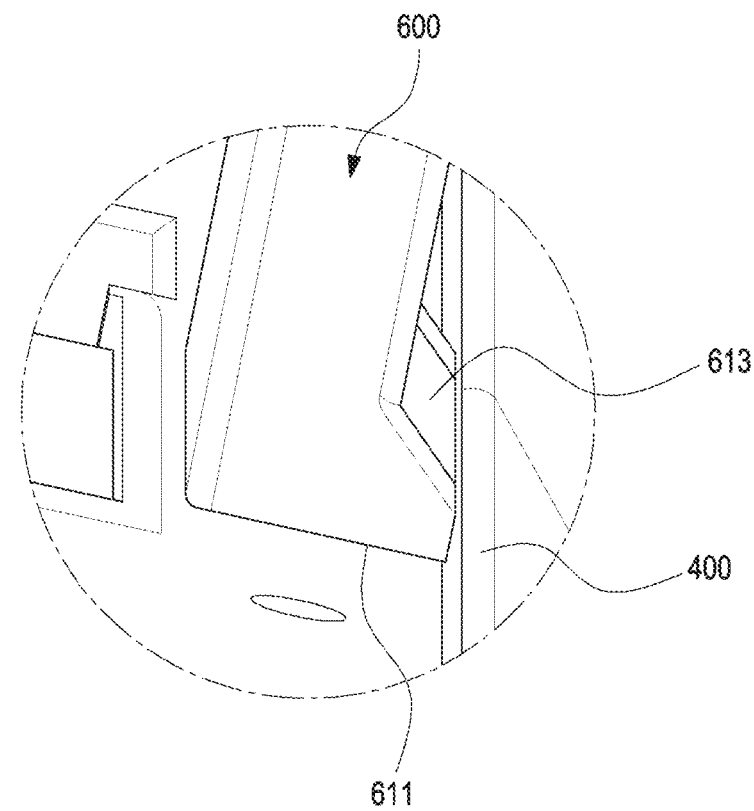
FIG. 8B is an enlarged perspective view of a region in FIG. 8A.

FIG. 8A is a perspective view illustrating a gas discharge region formed due to contact between a gas vent structure and a mid-plate, according to various embodiments. FIG. 8B is an enlarged perspective view of a region D in FIG. 8A.

Figure 9:
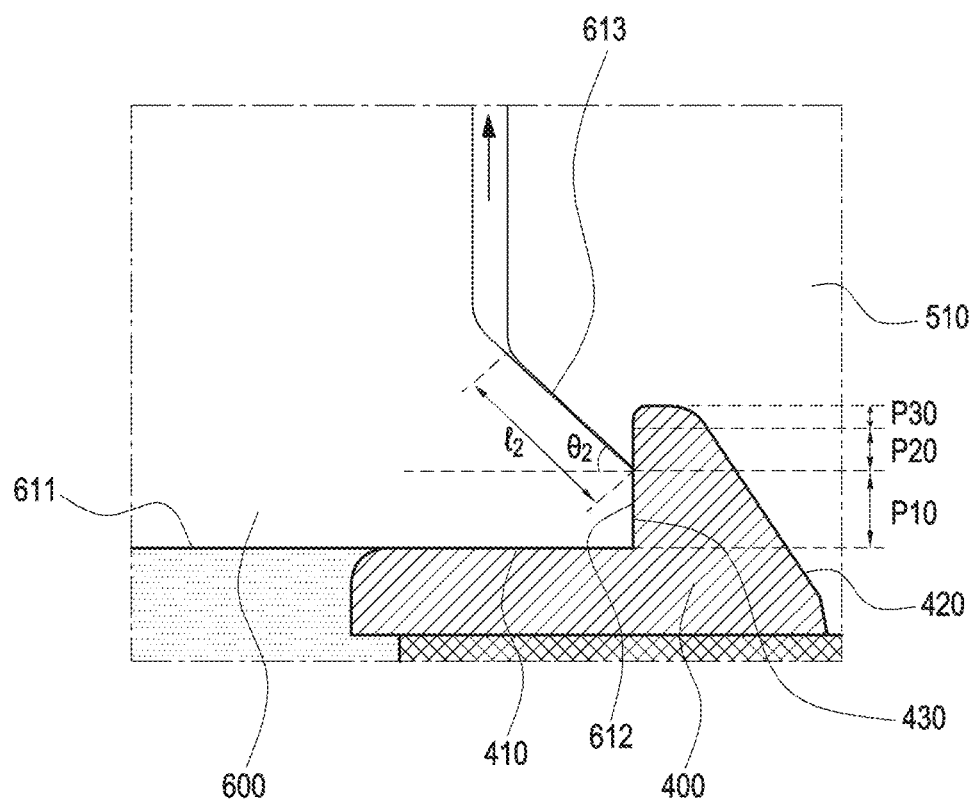
FIG. 9 is an enlarged cross-sectional view of a region of FIG. 8A, according to various embodiments of the disclosure.

FIG. 9 is an enlarged cross-sectional view of a region of FIG. 8A.

Referring to FIGS. 8A to 9, the mid-plate 400 of the electronic device 101 may be manufactured through an injection molding process, and the gas collected in the first portion (e.g., the first portion A in FIG. 4A) of the mid-plate 400 in the injection molding process is capable of being removed by the gas vent structure 600. The injection mold structure 500 including the gas vent structure 600 is capable of improving the quality of the mid-plate 400. The configuration of the mid-plate 400 of FIGS. 2 to 4B may be applied to the configuration of the mid-plate 400 of the electronic device 101 of FIGS. 8A to 9, and the configuration of the gas vent structure 600 of the injection mold structure 500 of FIGS. 5 to 7B may be applied to the configuration of the gas vent structure 600 of the injection mold structure 500 of FIGS. 8A to 9. For convenience of description, FIGS. 8A and 8B illustrate only the shape in which only the gas vent structure 600 of the injection mold structure 500 is located in the first portion A of the mid-plate 400. In addition, FIG. 9 illustrates the positional relationship of a completely injection-molded mid-plate 400 with the injection mold structure 500.

According to various embodiments, in the injection molding process, the gas vent structure 600 may be located on a portion of the mid plate 400. For example, the lower face 611 of the gas vent portion 610 is disposed to face the first surface 410 of the first portion A, and the side face 612 may be disposed to face the third surface of the first portion A. In the first portion A, the region that does not face the gas vent structure 600 (e.g., a portion of the third surface 430 and the second surface 420) may be disposed to face the upper core structure 510.

According to various embodiments, the gas vent portion 610 may form an inclined surface 613 forming a predetermined slope $\theta_2$, and an end portion of the inclined face 613 may be located in a region of the third surface 430. For example, the end portion of the inclined face 613 may be located on one surface of the second section P20 (e.g., the $(3\text{-}2)_{th}$ surface 432 in FIG. 4B). The one surface of the second section P20 is a region disposed between the first section P10 and the third section P30, and may be provided in a length from a point corresponding to a height of ½ of that of the third surface 430 to a point from which the curved face is formed.

According to various embodiments, the inclined face 613 formed by the gas vent portion 610 may form a predetermined angle $\theta_2$ and a predetermined length $l_2$ with respect to the lower face 611. For example, the predetermined angle $\theta_2$ may have a value of about 30 degrees to 60 degrees. As another example, the predetermined length $l_2$ may have a value of about 0.001 mm to 0.05 mm. As another example, the predetermined length $l_2$ may have a value of about 0.015 mm. Accordingly, the gas generated in the injection molding process may move to the second section P20, and may move upward along the inclined face 613 of the gas vent portion 610. Thereafter, the gas discharged from the inclined face 613 may be discharged to the outside along one conduit formed by the upper core structure 510 and the guide groove 621, which are coupled to each other. The formed tube may be disposed in a direction perpendicular to the lower face 611, so that gas can be quickly discharged to the outside.

According to various embodiments, after the injection molding process is completed, a protrusion may be formed on one face of the second section P20 of the mid-plate 400. The protrusion may be a burr or flake generated when an injection-molded product is formed, and may be formed in the lower portion of the third section P30 formed as a curved face. Thus, the protrusion is not visible in the field of view when viewed from the outside of the electronic device.

Figure 10:
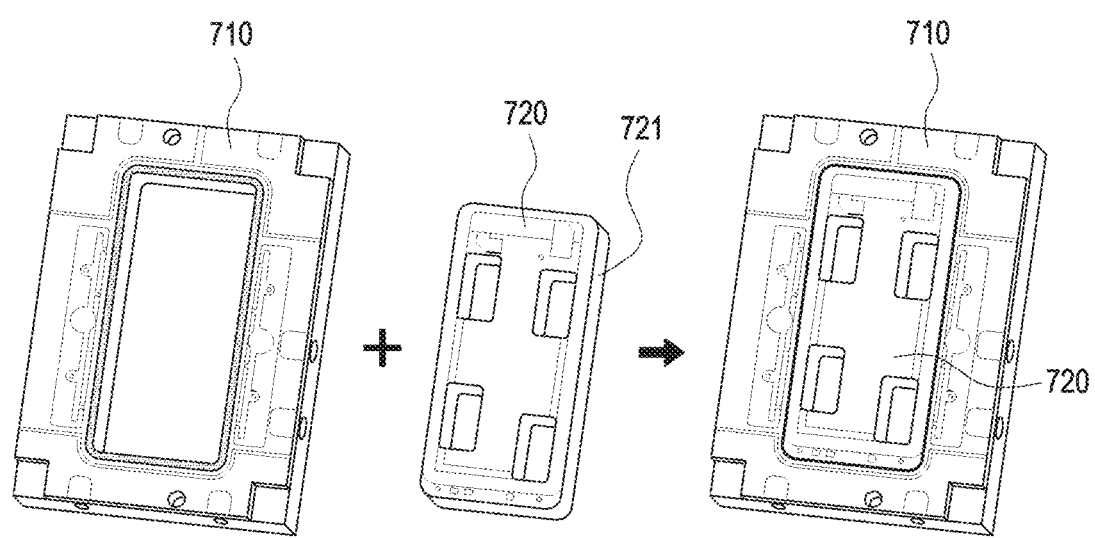
FIG. 10 is a perspective view illustrating an injection mold structure for manufacturing a housing, according to another embodiment of the disclosure.

FIG. 10 is a perspective view illustrating an injection mold structure for manufacturing a housing, according to another embodiment.

Referring to FIG. 10, an injection mold structure 500 for manufacturing a mid-plate (e.g., the mid-plate 400 in FIGS. 4A and 4B) of an electronic device 101 of FIGS. 2 to 4B may include an upper core structure 710, a lower core structure, and a gas vent structure 720 disposed inside the upper core structure 710. With reference to the structure of the injection mold structure 500 of FIG. 10, the upper core 710 and the gas vent structure 720 will be described.

According to various embodiments, the gas vent structure 720 may be manufactured in a shape corresponding to the overall shape of the mid-plate 400, and may include a gas vent portion 721 including an inclined face through which gas can be easily discharged. For example, the gas vent portion 721 may form a predetermined angle and a predetermined length along the edge of the mid-plate 400. For example, the predetermined angle may have a value of about 30 degrees to 60 degrees. As another example, the predetermined length may have a value of about 0.001 mm to 0.05 mm. As another example, the predetermined length may have a value of about 0.015 mm.

The gas vent structure 720 according to the embodiment of FIG. 10 is provided with a large area vent structure compared to the gas vent structure 600 of FIGS. 5 to 7B so that it is possible to increase the gas discharge rate and to improve the speed of the injection molding process.

Figure 11A:
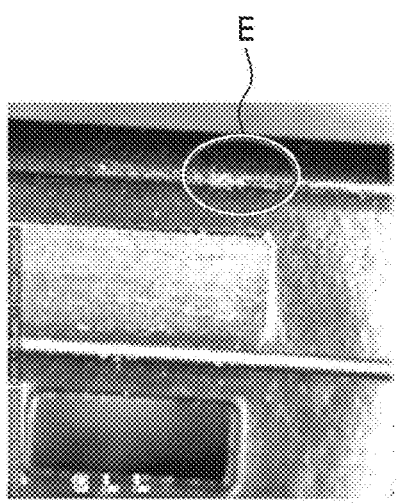
FIG. 11A and FIG. 11B are an enlarged photograph of one surface of a mid plate of an electronic device according to various embodiments of the present disclosure.
Figure 11B:
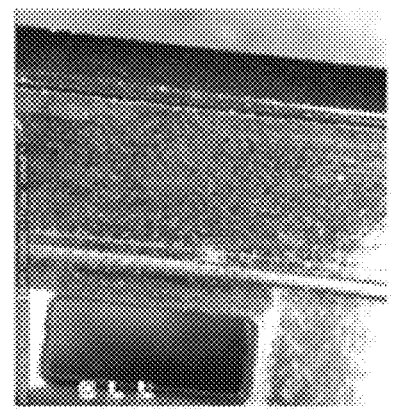

FIGS. 11A and 11B are enlarged photographs each showing a portion of a mid-plate of an electronic device according to various embodiments. FIG. 11A shows the state of a portion of a mid-plate after a general injection molding process was performed, and FIG. 11B shows the state of a portion of a mid-plate after the injection molding process according to an embodiment was performed.

The description of the configuration of the mid-plate of the electronic device in FIGS. 2 to 4B is applicable to the description of the configuration of the mid-plate illustrated in FIG. 11B, and the mid-plate of FIG. 11B may be a mid-plate formed through an injection molding process using the injection mold structure of FIGS. 8A to 11.

Referring to the photograph of FIG. 11B in comparison to FIG. 11A, it can be seen that the mid-plate according to this disclosure has a curved portion having a shape in which no foreign matter is visible and has a surface implemented to be relatively beautiful and uniform as a whole. The surface E of the mid-plate of FIG. 11A has a burr or flake formed in a gap in a parting line (P/L) portion. Accordingly, in order to remove the burr or flake, a separate process (e.g., a polishing process) should be performed. In the surface of the mid-plate of FIG. 11B, which was manufactured using the injection mold structure according to this disclosure, no burr or flake is generated in the parting line (P/L) portion, and thus the mid-plate may be used as a product without being subjected to an additional process. Accordingly according to an embodiment, a mid-plate of an electronic device may be implemented to have an unpainted glossy injection-molded face, and an additional process is excluded, resulting in reduction of a material cost and increase of production speed.

According to various embodiments, an electronic device (e.g., the electronic device 101 in FIGS. 1 to 3) may include: a housing (e.g., the housing 310 in FIG. 2A) including a front plate (e.g., the front plate 302 in FIG. 2A) oriented in a first direction (e.g., the first direction (+Z axis direction) in FIG. 4B), a rear plate (e.g., the rear plate 311 in FIG. 2B) oriented in a second direction (e.g., the second direction (−Z axis direction) in FIG. 4B) opposite the first direction, and a side member (e.g., the side member 318 in FIG. 2A) surrounding an internal space between the front plate and the rear plate; a display (e.g., the display 330 in FIG. 2A) visible through at least a portion of the front plate; and a mid-plate (e.g., the mid-plate 400) located between the front plate and the rear plate. The mid-plate may include a first portion (e.g., the first portion A in FIG. 4A) disposed between the front plate and the side member when viewed from the outside of the housing. The first portion may include: a first surface (e.g., the first surface 410 in FIG. 4B) supporting a portion of the front plate and oriented in the first direction; a second surface (e.g., the second surface 420 in FIG. 4B) exposed to the outside of the housing; a third surface (e.g., the third surface 430 in FIG. 4B) oriented in a third direction different from the first direction and the second direction, and facing a side face of the front plate; and a protrusion (e.g., the protrusion 450 in FIG. 4B) protruding in the third direction on the third surface.

According to various embodiments, the protrusion may be located between a first point (e.g., the first point B1 in FIG. 4A) at which the first surface meets the third surface and a second point (e.g., the second point B2 in FIG. 4A) at which the second surface meets the third surface when viewed in a cross section of the first portion.

According to various embodiments, the protrusion may be disposed at substantially a same distance from the first point and the second point.

According to various embodiments, the third direction may be substantially perpendicular to the first direction.

According to various embodiments, the first portion may include: a first region (e.g., the first region S1 in FIG. 4B) including a region exposed to the outside of the electronic device; and a second region (e.g., the second region S2 in FIG. 4B) extending from the first region and supporting the display.

According to various embodiments, the first region may include: a first section the first section P10 in FIG. 4B) extending from an end of the second region; a second section (e.g., the second section P20 in FIG. 4B) extending from the first section in the first direction; and a third section (e.g., the third section P30 in FIG. 4B) extending from the second section in the first direction and including a curved shape on a face oriented in the first direction.

According to various embodiments, the first region may be inclined or curved so as to gradually decrease in size from the first section toward the second section and the third section.

According to various embodiments, the third surface may include: a $(3-1)_{th}$ face (e.g., the $(3-1)_{th}$ face 431 in FIG. 4B) disposed in the first section and having a length of 40% to 60% of the third surface; a $(3-2)_{th}$ face (e.g., the $(3-2)_{th}$ face 432 in FIG. 4B) disposed in the second section and extending from the $(3-1)_{th}$ face; and a $(3-3)_{th}$ face (e.g., the $(3-3)_{th}$ face 433 in FIG. 4B) disposed in the third section and extending from the $(3-3)_{th}$ face so as to form a curved face. The protrusion may be disposed to protrude from a portion of the $(3-2)_{th}$ face toward an inside of the electronic device.

According to various embodiments, the protrusion may be disposed so as not to be exposed to a field of view when viewed from the outside of the electronic device.

According to various embodiments, the height of the second section may be smaller than the height of the first section, the height of the first section is smaller than the height of the second section, and the height of the third section may have a length of 0.1 mm to 0.4 mm.

According to various embodiments, the third surface may form a predetermined slope with respect to a first direction perpendicular to the first surface, and the predetermined slope may range from 1 degree to 4 degrees.

According to various embodiments, the first portion and the protrusion may be formed of the same injection-molded material, and the injection-molded material may be at least one of polystyrene (PS), acrylonitile butadiene styrene (ABS), polyphthalamide (PPA), polyamide (PA), polyphenylene sulfide (PPS), modified polyphenylene oxide (MPPO), acrylic, or polycarbonate (PC).

According to various embodiments, the mid-plate may be manufactured through injection molding, and the gas generated during the injection molding may be discharged from the $(3-2)_{th}$ surface of the second section.

According to various embodiments, a plurality of first portions, in each of which the protrusion is formed, may be disposed along an edge region of the electronic device.

According to various embodiments, the mid-plate may be made to have an unpainted and glossy injection-molded face.

An electronic device (e.g., the electronic device 101 in FIGS. 1 to 3) according to various embodiment may include: a display (e.g., the display 330 in FIG. 2A); and a housing (e.g., the housing 310 in FIG. 2A) including a first region (e.g., the first region S1 in FIG. 4B) including a portion exposed to an outside of the electronic device and a second region (e.g., the second region S2 in FIG. 4B) supporting at least a portion of the display. The first region may include: a first section (e.g., the first section P10 in FIG. 4B) extending from an end of the second region; a second section (e.g., the second section P20 in FIG. 4B) extending from the first section in a first direction (+Z axis direction) and including at least one protrusion (e.g., the protrusion 450 in FIG. 4B) protruding into the electronic device; and a third section (e.g., the third section P30 in FIG. 4B) extending from the second section in the first direction and including a curved shape on a face oriented in the first direction. The protrusion may be disposed not to be exposed to an outside of the electronic device.

An injection mold structure (e.g., the injection mold structure 550 in FIG. 5) for manufacturing at least a portion of an electronic device (e.g., the electronic device 101 in FIGS. 1 to 3), according to various embodiments, may include: an upper core structure (e.g., the upper core structure 510 in FIG. 5A); a lower core structure (e.g., the lower core structure 520) configured to be coupled with the upper core structure; and a gas vent structure (e.g., the gas vent structure 600 in FIG. 7A) disposed inside the upper core structure and configured to discharge gas generated during molding to an outside. The gas vent structure may be disposed to penetrate at least a portion of an inner portion of the upper core, and a region adjacent to the lower end portion of the gas vent structure may form an inclined face (e.g., the inclined face 613 in FIG. 7A) including a predetermined slope.

According to various embodiments, the gas vent structure may include: a gas vent portion (e.g., the gas vent portion 610 in FIG. 7A) provided in a single plate shape and including the inclined face, the gas vent portion being configured to discharging the gas; and a guide portion (e.g., the guide portion 620 in FIG. 7A) extending from the gas vent portion and guiding a path of the gas.

According to various embodiments, the inclined face of the gas vent portion may include a flat line shape, and may form a predetermined angle and a predetermined length with respect to a lower face of the gas vent portion. The predetermined angle may have a value of 30 to 60 degrees, and the predetermined length may have a value of 0.001 mm to 0.05 mm.

According to various embodiments, the guide portion includes a guide groove (e.g., the guide groove 621 in FIG. 7A) co netted to the outside, and the guide groove and one face of the upper core structure may be coupled to each other so as to form a single tube. The tube may provide a passage for discharging the gas, provided through the gas vent portion, to the outside.

According to various embodiments, a direction in which the inclined face of the gas vent portion is oriented and a direction in which the guide groove is oriented may be different from each other, and the inclined face may be disposed to face a recess formed inside an injection-molded structure of an electronic device to be manufactured.

It may be apparent to a person ordinarily skilled in the technical field to which the disclosure belongs that the above-mentioned electronic device according to various embodiments and an injection mold structure for manufacturing the electronic device are not limited by the above-mentioned embodiment and drawings, and may be variously substituted, modified, and changed within the technical scope of the disclosure.

The invention claimed is:

1. An electronic device comprising:
    a housing including a front plate oriented in a first direction, a rear plate oriented in a second direction opposite the first direction, and a side member surrounding an internal space between the front plate and the rear plate;
    a display visible through at least a portion of the front plate; and
    a mid-plate located between the front plate and the rear plate,
    wherein, the mid-plate includes a first portion disposed between the front plate and the side member when viewed from an outside of the housing, and the first portion includes:
        a first surface supporting a portion of the front plate and oriented in the first direction;
        a second surface exposed to the outside of the housing;
        a third surface oriented in a third direction different from the first direction and the second direction, and facing a side face of the front plate; and
        a protrusion protruding in the third direction on the third surface,
    wherein the first portion includes:
        a first region including a region exposed to the outside; and
        a second region extending from the first region and supporting the display,
    wherein the first region includes:
        a first section extending from an end of the second region;
        a second section extending from the first section in the first direction; and
        a third section extending from the second section in the first direction and including a curved shape on a face oriented in the first direction, and
    wherein the third surface includes:
        a (3-1)$^{th}$ face disposed in the first section and having a length of 40% to 60% of the third surface;
        a (3-2)$^{th}$ face disposed in the second section and extending from the (3-1)$^{th}$ face; and
        a (3-3)$^{th}$ face disposed in the third section and extending from the (3-2)$^{th}$ face so as to form a curved face, and
        the protrusion is disposed to protrude from a portion of the (3-2)$^{th}$ face toward an inside of the electronic device.

2. The electronic device of claim 1, wherein the protrusion is located between a first point at which the first surface meets the third surface and a second point at which the second surface meets the third surface when viewed in a cross section of the first portion.

3. The electronic device of claim 2, wherein the protrusion is disposed at a same distance from the first point and the second point.

4. The electronic device of claim 2, wherein the third surface forms a predetermined slope with respect to a first direction perpendicular to the first surface, and
    the predetermined slope ranges from 1 degree to 4 degrees.

5. The electronic device of claim 2, wherein the first portion and the protrusion are formed of a same injection-molded material, and
    the injection-molded material is at least one of polystyrene (PS), acrylonitile butadiene styrene (ABS), polyphthalamide (PPA), polyamide (PA), polyphenylene sulfide (PPS), modified polyphenylene oxide (MPPO), acrylic, or polycarbonate (PC).

6. The electronic device of claim 2, wherein the mid-plate is manufactured through injection molding, and
    gas generated during the injection molding is discharged from the (3-2)$^{th}$ surface of the second section.

7. The electronic device of claim 2, wherein a plurality of first portions, in each of which the protrusion is formed, are disposed along an edge region of the electronic device.

8. The electronic device of claim 1, wherein the third direction is perpendicular to the first direction.

9. The electronic device of claim 1, wherein the first region is inclined or curved so as to gradually decrease in size from the first section toward the second section and the third section.

10. The electronic device of claim 1, wherein the protrusion is disposed so as not to be exposed to a field of view when viewed from the outside.

11. The electronic device of claim 1, wherein a height of the second section is smaller than a height of the first section,
a height of the third section is smaller than a height of the second section, and
the height of the third section has a length of 0.1 mm to 0.4 mm.

12. An electronic device comprising:
a display; and
a housing including a first region including a portion exposed to an outside of the electronic device and a second region supporting at least a portion of the display,
wherein the first region includes:
  a first section extending from an end of the second region;
  a second section extending from the first section in a first direction and including at least one protrusion protruding into the electronic device; and
  a third section extending from the second section in the first direction and including a curved shape on a face oriented in the first direction, and
the protrusion is disposed not to be exposed to an outside of the electronic device,
wherein the second region includes:
  a first surface supporting at least the portion of the display,
wherein the first region includes:
  a third surface oriented in a third direction different from the first direction, and
facing a side face of the display,
wherein the third surface includes:
  a $(3\text{-}1)^{th}$ face disposed in the first section and having a length of 40% to 60% of the third surface;
  a $(3\text{-}2)^{th}$ face disposed in the second section and extending from the $(3\text{-}1)^{th}$ face; and
  a $(3\text{-}3)^{th}$ face disposed in the third section and extending from the $(3\text{-}2)^{th}$ face so as to form a curved face, and
the protrusion is disposed to protrude from a portion of the $(3\text{-}2)^{th}$ face toward an inside of the electronic device.

* * * * *